United States Patent
Kanskar

(10) Patent No.: US 9,270,085 B1
(45) Date of Patent: Feb. 23, 2016

(54) MULTI-WAVELENGTH LASER DEVICE

(71) Applicant: nLIGHT Photonics Corporation, Vancouver, WA (US)

(72) Inventor: Manoj Kanskar, Portland, OR (US)

(73) Assignee: nLIGHT Photonics Corporation, Vancouver, WA (US)

( * ) Notice: Subject to any disclaimer, the term of this patent is extended or adjusted under 35 U.S.C. 154(b) by 0 days.

(21) Appl. No.: 14/547,116

(22) Filed: Nov. 18, 2014

Related U.S. Application Data

(60) Provisional application No. 61/905,830, filed on Nov. 18, 2013.

(51) Int. Cl.
| | | |
|---|---|---|
| *H01S 3/08* | (2006.01) | |
| *H01S 5/34* | (2006.01) | |
| *H01S 5/187* | (2006.01) | |
| *H01S 5/14* | (2006.01) | |
| *H01S 5/12* | (2006.01) | |
| *H01S 5/125* | (2006.01) | |

(52) U.S. Cl.
CPC ... *H01S 5/34* (2013.01); *H01S 5/12* (2013.01); *H01S 5/125* (2013.01); *H01S 5/1215* (2013.01); *H01S 5/14* (2013.01); *H01S 5/141* (2013.01); *H01S 5/187* (2013.01)

(58) Field of Classification Search
CPC ......... H01S 5/141; H01S 5/14; H01S 5/1215; H01S 5/12; H01S 5/125; H01S 5/187
USPC ................. 372/50.11, 50.1, 102, 101, 98, 92, 372/45.01
See application file for complete search history.

(56) References Cited

U.S. PATENT DOCUMENTS

| | | | | |
|---|---|---|---|---|
| 5,581,572 | A * | 12/1996 | Delorme et al. | 372/50.11 |
| 5,926,493 | A * | 7/1999 | O'Brien et al. | 372/50.11 |
| 5,993,073 | A * | 11/1999 | Hamakawa et al. | 385/88 |
| 6,507,597 | B1 | 1/2003 | Graindorge et al. | |
| 6,647,031 | B2 | 11/2003 | Delfyett et al. | |
| 6,728,290 | B1 | 4/2004 | Coleman et al. | |
| 2006/0251134 | A1 * | 11/2006 | Volodin et al. | 372/22 |

OTHER PUBLICATIONS

Huang et al., "Carrier Capture Competition Between Two Different Quantum Wells in Dual-Wavelength Semiconductor Lasers," IEEE Photonics Technology Letters, 8(6):752-754 (Jun. 1996).

(Continued)

*Primary Examiner* — Kinam Park
(74) *Attorney, Agent, or Firm* — Klarquist Sparkman, LLP

(57) ABSTRACT

A multi-wavelength semiconductor diode laser device includes a semiconductor diode gain medium including one or more quantum well structures, each of the quantum well structures having an associated gain peak, the semiconductor gain medium further including a back facet configured for high reflection of laser light therein and a front facet configured for coupling a laser beam therefrom, one or more collimation optics configured to receive the laser beam, and an external volume Bragg grating configured to reflect a portion of the laser beam and narrow the wavelength of at least a portion of the light generated by the semiconductor gain medium to a selected wavelength corresponding to at least one of the gain peaks, wherein an output beam is coupled out of the external volume Bragg grating, the output beam having a plurality of output wavelengths.

13 Claims, 1 Drawing Sheet

(56) References Cited

OTHER PUBLICATIONS

Kononenko et al., "Asymmetric multiple-quantum-well heterostructure laser systems: conception, performance, and characteristics," Opto-Electronics Review, 8(3):241-250 (2000).

Reddy, "Wide Stripe Single and Dual Wavelength Mode Semiconductor Diode Lasers," Dissertation for the University of Illinois at Urbana-Champaign, 99 pages (2011).

Poguntke et al., "Simultaneous multiple wavelength operation of a multistripe array grating integrated cavity laser," Appl. Phys. Lett., 62(17):2024-2026 (Apr. 26, 1993).

* cited by examiner

MULTI-WAVELENGTH LASER DEVICE

CROSS-REFERENCE TO RELATED APPLICATION

This application claims the benefit of provisional patent application 61/905,830 filed Nov. 18, 2013, which is incorporated herein by reference.

BACKGROUND OF THE INVENTION

1. Field of the Invention

Generally, the field of the present invention is multi-wavelength lasers. More particularly, the present invention relates to multi-wavelength semiconductor lasers with co-aligned output beams.

2. Background

Multi-wavelength laser systems have potential applications in many areas such as two-wavelength interferometry, laser spectroscopy, differential LIDAR, etc. For some of the applications, it is highly desirable to have the different wavelength beams to be co-aligned to within a few tens of microradian accuracy. In the semiconductor laser arts, providing an array of lasers with physically separated gain media for each wavelength is a common approach for multiple-wavelength operation. Dual-wavelength operation with a single semiconductor gain medium has also been achieved. However, these solutions resort to multi-component and complicated architectures to achieve dual or multi-wavelength output. Because of efficiency limitations, these devices tend to operate with low output powers. More importantly, some of these architectures do not provide a co-aligned multi-wavelength beam. Innovations herein are directed to overcoming the attendant problems of prior art architectures and other drawbacks.

SUMMARY OF THE INVENTION

In one aspect of the present invention, a semiconductor laser architecture includes a semiconductor laser with multiple quantum wells, each with different gain peaks so as to expand the gain bandwidth of the semiconductor laser, and an external volume Bragg grating. In some examples, the volume Bragg grating is a monolithic optical component with multiple reflection gratings imbedded therein. In other examples, a plurality of physically separate volume Bragg gratings are placed in tandem. The volume Bragg grating or gratings are selected to narrow or lock the output beam of the semiconductor laser to desired multiple wavelengths which overlap the wide gain bandwidth of the semiconductor laser. As a result, the different portions of the output beam having different wavelengths are co-aligned in a compact and efficient way.

In another aspect of the present invention a multi-wavelength semiconductor diode laser device is provided which includes a semiconductor diode gain medium including one or more quantum well structures, each of the quantum well structures having an associated gain peak, the semiconductor gain medium further including a back facet configured for high reflection of laser light therein and a front facet configured for coupling a laser beam therefrom, one or more collimation optics configured to receive the laser beam, and an external volume Bragg grating configured to reflect a portion of the laser beam and narrow the wavelength of at least a portion of the light generated by the semiconductor gain medium to a selected wavelength corresponding to at least one of the gain peaks, wherein an output beam is coupled out of the external volume Bragg grating, the output beam having a plurality of output wavelengths.

In another aspect of the present invention a multi-wavelength semiconductor diode laser device is provided which includes a semiconductor diode gain medium including one or more quantum well structures, each of the quantum well structures having an associated gain peak, the semiconductor gain medium further including a back facet configured for high reflection of laser light therein and a front facet configured for coupling a laser beam therefrom, one or more collimation optics configured to receive the laser beam, and an internal Bragg grating configured to narrow the wavelength of at least a portion of the light generated by the semiconductor gain medium to a selected wavelength corresponding to at least one of the gain peaks, wherein an output beam is coupled out of the external volume Bragg grating, the output beam having a plurality of output wavelengths.

The foregoing and other objects, features, and advantages will become more apparent from the following detailed description, which proceeds with reference to the accompanying figures which are not necessarily drawn to scale, and which in some cases are exaggerated for illustrative purposes.

DETAILED DESCRIPTION OF THE INVENTION

Figure 1:
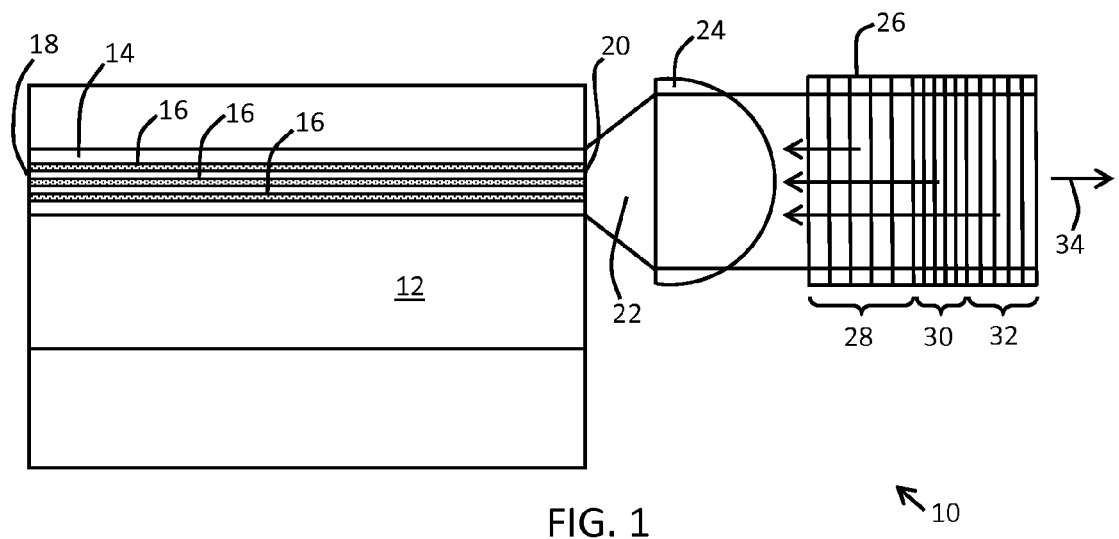
FIG. 1 is a side cross-sectional view of a multi-wavelength diode laser in accordance with an aspect of the present invention.

With reference to FIG. 1, a side cross-sectional view is shown for a multi-wavelength semiconductor laser device 10 in accordance with an embodiment of the present invention. The semiconductor laser device 10 includes a semiconductor diode laser 12 having a gain medium 14 associated with laser operation. The gain medium 14 has a plurality of quantum well structures 16 disposed therein. In the specific embodiment shown in FIG. 1, three quantum well structures 16 are shown, though it will be appreciated that the number of quantum well structures can vary in accordance with various design requirements, as will be discussed herein. Each quantum well structure 16 has an associated gain peak, and at least two quantum wells structures of the plurality of quantum well structures of the semiconductor laser 12 have gain peaks different from each other. In some examples of semiconductor laser 12, each quantum well structure 16 of the plurality of quantum well structures has a gain peak different from each other respective quantum well structure in the gain medium 14. Each quantum well structure 16 can provide a few to several tens of nanometers of gain bandwidth for laser operation and the total bandwidth of the semiconductor diode laser 12 is a combination of the bandwidths of all the quantum well structures 16.

The semiconductor diode laser 12 is preferably a broad area type semiconductor diode laser which can be fabricated in various ways, including epitaxial growth using one or more conventional methods, such as chemical vapor deposition or molecular beam epitaxy. Diode lasers 12 are typically on the order of mm in length, which is generally the horizontal direction in FIG. 1, forming the laser cavity 14 between a highly reflective rear facet 18 and a partially reflective front facet 20. The vertical direction in FIG. 1 generally defines a fast axis associated with the laser beam 22 emitted through the front facet 20. The emitted beam 22 has a relatively large angular divergence in the fast axis since the thickness of the gain medium 14 is relatively thin, such as on the order of the wavelength of beam 22, in the fast axis direction. The orthogonal slow axis, which is generally into or out of the page of FIG. 1, is larger relative to the thickness of the gain medium 14, such as on the order of tens to hundreds of microns. It will be appreciated that the various dimensions are exaggerated in the depictions herein.

A fast-axis collimation (FAC) optic 24 is disposed in relation to the exit facet 20 of the semiconductor laser 12 such that the FAC 24 can receive the diverging laser light emitted from the exit facet 20 and collimate or reduce the divergence of the beam 22 with respect to the fast axis thereof. The beam 22 is received by a volume Bragg grating 26 situated to reflect a portion of the beam 22 such that the portion is back-coupled into the front facet 20 of the semiconductor diode laser 12. The volume Bragg grating 26 includes separate grating portions 28, 30, 32 each portion having different selected grating periodicities. The different grating periodicities are designed to selectively reflect different wavelengths or wavelength ranges associated with the quantum well structures 16 of the diode laser 12. Thus, the wide gain spectrum associated with the gain medium 14 becomes narrowed or locked at separate predetermined wavelengths corresponding to the different external Bragg grating portions 28, 30, 32. As shown, the volume Bragg grating 26 has each of the corresponding gratings combined to form a singular volume Bragg grating component. In other examples, the different grating portions can be spaced apart from each other. Additional optics and components can be disposed between the FAC 24 and VBG 26, or elsewhere in relation to the device 10 and components thereof, for desired effect, such as turning mirrors, slow axis collimators, multiplexers, etc.

More particularly, first volume Bragg grating portion 28 is disposed in relation to the FAC 24 such that the portion 28 can receive the laser light from the FAC and reflect at least a small portion of the light at a selected wavelength corresponding to the grating periodicity of the portion 28 back towards the FAC 24 for coupling back into the semiconductor laser 12 through the exit facet 20. The light selectively reflected by the first volume Bragg grating portion 28 operates to narrow or lock the wavelength output of some but not all of the light emitted by the semiconductor laser 12. The second volume Bragg grating portion 30 is disposed in relation to the FAC 24 and semiconductor laser 12 and performs a similar function as the first volume Bragg grating portion 28 but reflects at a second selected wavelength corresponding to the grating periodicity of the second portion 30 which is different from the first portion 28. The portion of reflected light at the second wavelength is coupled back into the semiconductor laser 12 through the exit facet 20 and serves to narrow the wavelength of some but not all of the light emitted by the semiconductor laser 12. A similar process occurs for the third volume Bragg grating portion 32 and can be extended to additional wavelengths where appropriate. A laser beam 34 having a plurality of characteristic wavelengths or wavelength ranges corresponding to the selected locking wavelengths is coupled out of the volume Bragg grating 26. The emission wavelengths of the multi-wavelength semiconductor laser device 10 are determined through careful selection of reflectivity of the front facet 20, center Bragg diffraction peaks, and diffraction efficiencies of the external volume Bragg grating 26. In some embodiments, the volume Bragg grating 26 can be a monolithic piece of glass with multiple embedded Bragg gratings portions. In further examples, multiple Bragg gratings with different Bragg wavelengths can be attached together, as shown in FIG. 1, or physically separated by a predetermined distance.

The selection of the number of quantum well structures 16 and external Bragg gratings 26 depends on several factors, including, for example, the desired emission wavelengths of the output beam 34, bandwidth of each wavelength as well as the spacing between the center wavelengths. In one example, a single quantum well structure with approximately 40 nm gain bandwidth can be used in conjunction with a single external volume Bragg grating to produce a semiconductor laser device capable of emitting an output beam having two wavelengths. The wavelength locked by the volume Bragg grating will have a bandwidth of less than about 0.5 nm and the free-running Fabry Perot wavelength selected by the front facet reflectivity will have a bandwidth of less than about 3 nm. The separation between the two wavelengths can be from about 2 nm to about 40 nm, though it will be appreciated that other bandwidths and bandwidth separations may be possible. Since the multiple wavelengths associated with the output beam 34 are generated in the gain medium 12, the propagation paths of the portions of the beam 34 associated with the respective multiple wavelengths are substantially coaligned with one another.

In another example, a semiconductor laser having a single quantum well structure emits a beam having a wavelength locked by a plurality of external Bragg gratings elements to wavelengths corresponding to the Bragg gratings. Each of the locked wavelengths have bandwidths of less than about 0.5 nm and the spacing between adjacent locked wavelengths can be selected as desired subject to the limitation of the maximum span between the longest and the shortest wavelength, which will typically be on the order of about 40 nm. In another example, a semiconductor laser has a plurality of quantum well structures with corresponding gain peaks. The wavelength of the beam emitted by the semiconductor laser is narrowed with an external volume Bragg grating having multiple Bragg grating portions to a plurality of selected wavelengths. The selected wavelengths would produce a bandwidth of less than about 0.5 nm each and the spacing between each of the selected wavelengths can be chosen as desired, though the maximum span between the longest and the shortest wavelength will be on the order of many tens of nm.

Figure 2A:
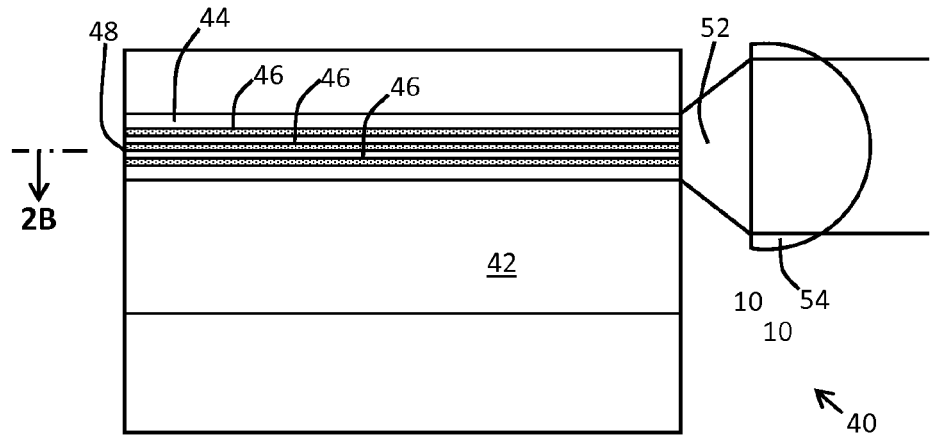
FIG. 2A is a side cross-sectional view of another multi-wavelength diode laser in accordance with a further aspect of the present invention.
Figure 2B:
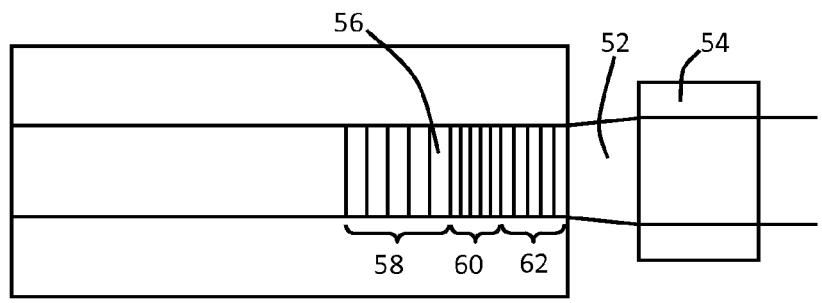
FIG. 2B is a top cross-sectional view of the multi-wavelength diode laser shown in FIG. 2A.

Referring to FIGS. 2A and 2B there is shown another embodiment of a multi-wavelength semiconductor device 40 in accordance with an aspect of the present invention. FIG. 2A shows the diode laser device 40 in side cross-section similar to that show in FIG. 1. The device 40 includes a semiconductor diode laser 42 having a gain medium 44 with multiple quantum well structures 46 disposed therein. While three quantum well structures 46 are shown in FIG. 2A it will be appreciated that more or fewer quantum well structures can be used. Laser operation occurs in relation to a high reflecting back facet 48 and partially reflecting front facet 50 which out-couples a multi-wavelength laser beam 52. A fast axis collimation optic 54 is disposed in relation to the output beam 52 and collimates the divergent light thereof for subsequent application. The different quantum well structures can have different gain peaks so as to provide a few to tens of nm of gain bandwidth.

As shown in FIG. 2B, a top cross-sectional view depicts a view of the gain medium 42 relative to a slow axis of the output beam 52. A distributed Bragg reflection grating 56 is disposed in the gain medium 42 for wavelength locking the laser light propagating therein. The grating 56 includes a plurality of distributed Bragg reflection grating portions 58,

60, 62 with different selected grating periodicities each selected to lock different selected wavelengths associated with the quantum well structures 46. While the grating portions are shown to be adjoining each other, it will be appreciated that the gratings can occur in different locations and have different widths depending on various design requirements and optimizations. Thus, the wider gain spectrum associated with the quantum well structures 46 absent the distributed Bragg reflection grating 56 can become narrowed and locked at separate predetermined wavelengths corresponding to the different internal grating portions 58, 60, 62. It will be appreciated that more or fewer internal grating portions can be used in different embodiments.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. A multi-wavelength semiconductor diode laser device, comprising:
    a semiconductor diode gain medium including one or more quantum well structures, each of the quantum well structures having an associated gain peak, the semiconductor gain medium further including a back facet configured for high reflection of laser light therein and a common front facet situated to emit a laser beam therefrom along a common emission axis;
    one or more collimation optics configured to receive the laser beam; and
    an external volume Bragg grating having a variable grating periodicity along the common emission axis and situated to reflect a portion of the laser beam back along the common emission axis and into the common front facet and to narrow the wavelength of at least a portion of the light generated by the semiconductor gain medium to a selected wavelength corresponding to at least one of the gain peaks so that an output beam is generated in the semiconductor diode gain medium and emitted from the common front facet and coupled out of the external volume Bragg grating along the common emission axis, the output beam having a plurality of output wavelengths.

2. The device of claim 1, wherein the one or more quantum well structures is a plurality of quantum well structures.

3. The device of claim 2, wherein at least two of the associated gain peaks are different from each other.

4. The device of claim 1, wherein the volume Bragg grating includes a plurality of grating portions each configured to reflect at a different selected wavelength.

5. The device of claim 1, wherein the plurality of output wavelengths includes a first wavelength corresponding to the volume Bragg grating and a second wavelength corresponding to the reflectivity of the front facet.

6. A multi-wavelength semiconductor diode laser device, comprising:
    a semiconductor diode gain medium including one or more quantum well structures, each of the quantum well structures having an associated gain peak, the semiconductor gain medium further including a back facet configured for high reflection of laser light therein and a front facet configured for coupling a laser beam therefrom;
    one or more collimation optics configured to receive the laser beam; and
    an internal Bragg grating configured to narrow the wavelength of at least a portion of the light generated by the semiconductor gain medium to a selected wavelength corresponding to at least one of the gain peaks;
    wherein an output beam is coupled out of the internal volume Bragg grating, the output beam having a plurality of output wavelengths.

7. The device of claim 6, wherein the one or more quantum well structures is a plurality of quantum well structures.

8. The device of claim 7, wherein at least two of the associated gain peaks are different from each other.

9. The device of claim 6, wherein propagation paths associated with the plurality of output wavelengths of the output beam are substantially coaligned.

10. The device of claim 6, wherein the internal Bragg grating includes a plurality of grating portions each having a maximum reflectivity corresponding to different selected wavelengths.

11. The device of claim 6, wherein the internal Bragg grating is situated in the semiconductor diode gain medium.

12. An apparatus comprising:
    a diode laser having a gain medium situated between a single exit facet and a single back facet and one or more quantum well structures situated in the gain medium each having a corresponding gain peak, the diode laser situated to emit a beam from the single exit facet along a diode laser axis;
    a fast axis collimator situated to receive and to collimate the beam along a beam fast axis; and
    a volume Bragg reflector situated to receive the beam from the fast axis collimator and to reflect a portion of the beam back through the fast axis collimator and into the gain medium through the single exit facet so that the beam emitted from the single exit facet of the gain medium along the diode laser axis has a plurality of wavelengths.

13. The apparatus of claim 12, wherein the one or more quantum well structures is a plurality of quantum well structures.

* * * * *